United States Patent
Holsteyns et al.

(10) Patent No.: US 9,662,686 B2
(45) Date of Patent: May 30, 2017

(54) ULTRASONIC CLEANING METHOD AND APPARATUS

(75) Inventors: Frank Ludwig Holsteyns, Eksel (BE); Alexander Lippert, Villach (AT)

(73) Assignee: LAM RESEARCH AG, Villach (AT)

( * ) Notice: Subject to any disclaimer, the term of this patent is extended or adjusted under 35 U.S.C. 154(b) by 1399 days.

(21) Appl. No.: 12/889,975

(22) Filed: Sep. 24, 2010

(65) Prior Publication Data
US 2012/0073596 A1 Mar. 29, 2012

(51) Int. Cl.
 B08B 3/12 (2006.01)
 H01L 21/02 (2006.01)
 H01L 21/67 (2006.01)

(52) U.S. Cl.
 CPC ......... B08B 3/12 (2013.01); H01L 21/02052 (2013.01); H01L 21/67057 (2013.01)

(58) Field of Classification Search
 None
 See application file for complete search history.

(56) References Cited

U.S. PATENT DOCUMENTS

| | | | |
|---|---|---|---|
| 5,625,249 | A | 4/1997 | Grant |
| 6,290,778 | B1 | 9/2001 | Zugibe |
| 8,015,986 | B2 | 9/2011 | Ahn |
| 2004/0069319 | A1 | 4/2004 | Boyd et al. |
| 2004/0173238 | A1 * | 9/2004 | Boyd et al. ............ 134/1.3 |
| 2005/0003737 | A1 | 1/2005 | Montierth et al. |
| 2006/0137719 | A1 | 6/2006 | Hasegawa et al. |
| 2007/0169795 | A1 * | 7/2007 | Yi et al. .............. 134/94.1 |
| 2007/0207707 | A1 * | 9/2007 | Montierth et al. ........ 451/36 |
| 2007/0207710 | A1 | 9/2007 | Montierth et al. |
| 2008/0017219 | A1 * | 1/2008 | Franklin ............... 134/1 |
| 2008/0289971 | A1 | 11/2008 | Shigihara et al. |

FOREIGN PATENT DOCUMENTS

| | | |
|---|---|---|
| CN | 1822905 A | 8/2006 |
| CN | 1976765 A | 6/2007 |
| JP | 10-163153 | 6/1998 |
| JP | 2009178440 A | 8/2009 |
| TW | 200711754 | 4/2007 |
| TW | 200910433 A | 3/2009 |
| WO | 2004112093 | 12/2004 |

OTHER PUBLICATIONS

Palmer et al., Diffraction Grating Handbook, Retrieved from the Internet:<URL: Dec. 2005 (Dec. 2005) http://gratings.newport.com/library/handbook/chapter4.asp#4.0>.
International Search Report, dated May 8, 2012, from corresponding PCT application No. PCT/IB11/54195.
English translation of TW Notification of Examination Opinions, dated Apr. 29, 2014, from corresponding TW application.

* cited by examiner

Primary Examiner — Michael Kornakov
Assistant Examiner — Ryan Coleman (57) ABSTRACT

A device and method for treating the surface of a semiconductor wafer provides a treatment fluid in the form of a dispersion of gas bubbles in a treatment liquid generated at acoustic pressures less than those required to induce cavitation in the treatment liquid. A resonator supplies ultrasonic or megasonic energy to the treatment fluid and is configured to create an interference pattern in the treatment fluid comprising regions of pressure amplitude minima and maxima at an interface of the treatment fluid and the semiconductor wafer.

11 Claims, 7 Drawing Sheets

ULTRASONIC CLEANING METHOD AND APPARATUS

BACKGROUND OF THE INVENTION

1. Field of the Invention

The invention relates to the field of ultrasonic (including megasonic) cleaning of substrate surfaces.

2. Description of Related Art

Removal of particulate contaminants from a semiconductor substrate can be accomplished by ultrasonic cleaning. When the frequency of ultrasound is close to or above 1,000 kHz (1 MHz) it is often referred to as "megasonic".

Acoustically activated bubbles close to any liquid-surface interface causes (a) shear stress at the surface, which can lead to the removal of particulate contaminants from the surface, (b) microstreaming, which can lead to the enhancement of diffusion limited reactions beneficial for electrochemical deposition processes, etching, rinsing and mixing, and (c) local enrichment of active components close to the surface such as free radicals, ozone and plasma, to impact chemical processes such as oxidation processes and etching.

However, conventional ultrasonic and megasonic cleaning methods are not fully satisfactory as regards minimizing damage to the substrate during removal of nanoparticulate contamination, and avoiding cleaning patterns (i.e., non uniform removal).

There is therefore a need for treatment and cleaning technologies that effectively process or clean with minimal damage to the substrate.

SUMMARY OF THE INVENTION

It is accordingly an object of the present invention to produce a method and device for treating articles that overcomes, at least in part, the disadvantages of the conventional art.

The invention, in part, pertains to a device for treating an article that includes a holder for holding the article, a resonator for supplying ultrasonic or megasonic energy to the article, a generator for generating a treatment fluid in which a gas is dissolved preferably at a pressure of at least about 1 bar above the pressure at which the article is treated, and a fluid supplier for supplying the treatment fluid to the article, where the treatment fluid is a gas-containing fluid that generates a gas dispersion in the treatment fluid when the pressure is reduced. The dispersed gas bubbles can be tuned in size distribution and content (gas, vapor, chemicals).

The resonator is moreover configured to introduce an interference pattern in the liquid and consequently distinct regions of pressure amplitude minima and maxima are generated at the solid-liquid interface. In combination with the generation of the gas dispersion treatment fluid, many bubbles are present and active at the solid-liquid interface, which improves the process time and allows optimization of cleaning uniformity.

It is to be understood that both the foregoing general description and the following detailed description are exemplary and explanatory and are intended to provide further explanation of the invention as claimed, but are not intended to limit the scope of protection afforded by the appended claims.

BRIEF DESCRIPTION OF THE DRAWINGS

The accompanying drawings are included to provide a further understanding of the invention. The drawings illustrate embodiments of the invention and together with the description serve more fully to explain the principles of the embodiments of the invention.

FIG. 4b shows a right front view of the bubble machine of FIG. 4a.

DETAILED DESCRIPTION

The dynamic response of a bubble in liquid to an acoustic field includes typically a volumetric oscillation and a translation motion. Given an arbitrary starting position, it can be observed that a bubble in an acoustic field moves towards either a pressure amplitude maximum or a pressure amplitude minimum. In a relatively weak acoustic field, a bubble driven below resonance (which means that the driving frequency of the imposed ultrasound field is below the fundamental resonance frequency of the bubble (calculated by the Minnaert equation)) moves to the pressure amplitude maximum, while a bubble driven above resonance moves towards the pressure amplitude minimum.

Under normal conditions, bubbles remain at those positions they were driven to. The underlying mechanism is based on the primary Bjerknes force, which was first discovered and described by Bjerknes (1906). In an acoustic field of higher intensities a reversal of the primary Bjerknes force for bubbles below resonance size can be observed and these bubbles may reciprocate around a pressure amplitude minimum as shown by Doinikov (2001). Consequently, the creation of distinct regions of pressure minima and maxima in a liquid and at the solid-liquid interface allows creating either regions where bubbles are being (temporarily) collected or through which bubbles translate.

Furthermore, some of these bubbles exhibit, in addition to their volumetric oscillations, surface modes or even surface instabilities. These instabilities can grow and finally destroy the bubble. Besides bubble fragmentation, the mass of the bubble is continuously influenced by coalescence with other bubbles, rectified diffusion or dissolution. The thresholds for these activities are typically shown in a frequency dedicated phase diagram, which denotes the parametric regions for surface instabilities, translational stabilities, rectified diffusion and dissolution. Furthermore, the presence of a plane rigid wall affects the translational dynamics of bubbles. The interaction between bubble and wall makes them typically move towards the wall.

In semiconductor wafer cleaning the nucleation of the acoustic cavitation often requires the proper pre-treatment of the liquid and elevated acoustic pressures to achieve the onset of nucleation. Furthermore, this nucleation results in limited nucleation densities from which only a small portion, related to the size distribution, will be active in cleaning. Typically the elevated acoustic pressure will drive bubble oscillations to a more violent regime (transient cavitation), which usually causes damage. The ultrasonic cleaning process is thus often tuned for nucleation and not for its microscopic effects (results of the bubble activity), which is required to avoid any structural damage on, e.g., fragile structures present on the substrate.

Bubbles with improved cleaning properties can be provided by bubble injection into liquid, which is exposed to a designed soundscape. These bubbles can be tuned in size distribution and content (gas, vapor, chemicals). A structured resonator is provided to introduce an interference pattern in the liquid and consequently distinct regions of pressure amplitude minima and maxima are generated at the solid-liquid interface. Furthermore the creation of pressure amplitude maxima and minima on the solid-liquid interface are independent of the distance between resonator and substrate. In combination with the injection of specific bubbles, many bubbles are present and active at the solid-liquid interface, which improves the process time and allows optimization of the uniformity. The introduction of these bubbles allows to operate under the bubble initiation threshold, which enlarges the operating window enormously as regards the applied power, and consequently so too the particle removal efficiency (PRE) damage window (which in conventional techniques invariably associates a high degree of particle removal with a significant amount of substrate damage).

Figure 1A:
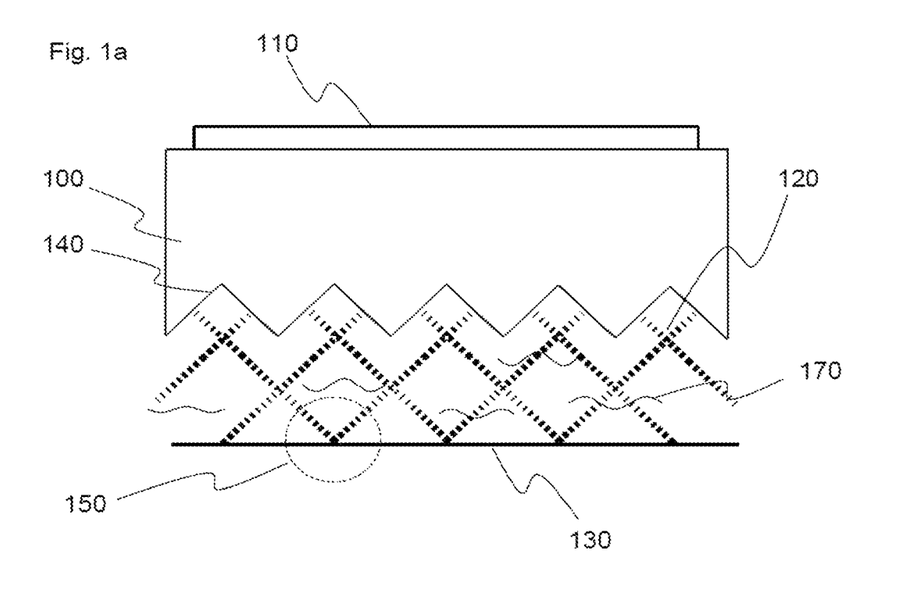
FIG. 1a shows a cross-sectional view of a resonator, with a solid structural element, where an interference pattern in the liquid and the solid-liquid interface is generated.

As shown in FIG. 1a, a piezoelectric crystal (110) is glued on a structured solid element (100). Together they form a resonator. This resonator is electrically driven at a resonance frequency, which corresponds to one of the structural resonances of the resonator and varies typically between 10 kHz and 10 MHz. The solid element is configured to generate a specific acoustic interference pattern (120) when the resonator is placed next to a substrate (130) and the gap is filled with a liquid (170). A typical example of such a structure is a series of triangular grooves (140), having typical dimension for the base and the height of each triangle of between 500 micrometer and 10 cm. The gap between the substrate and the resonator is typically on the order of 100 micron to about 10 mm, preferably 0.2 mm to 10 mm, and more preferably 0.2 mm to 3 mm.

Figures 1B, 1C, 1D, 1E:
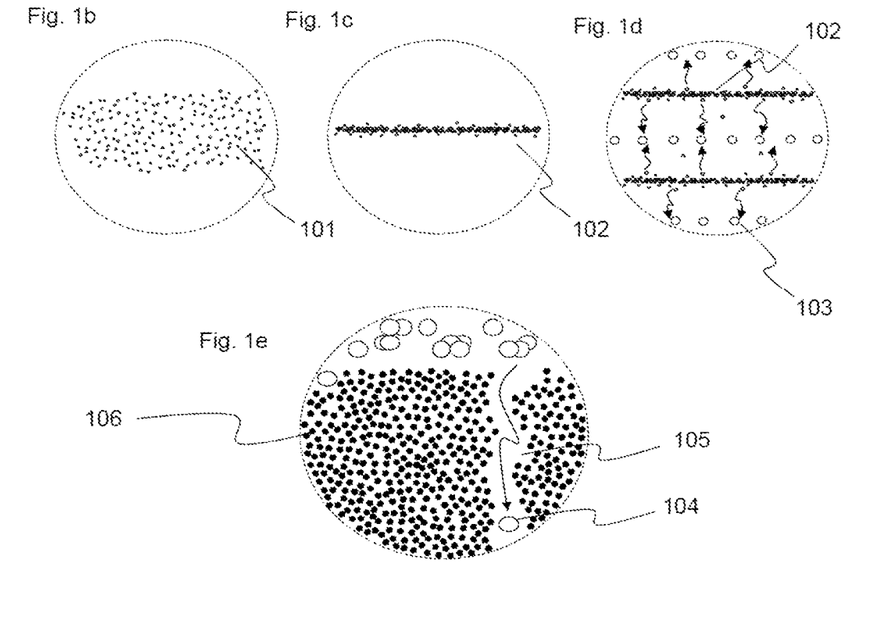
FIG. 1b shows a detailed view of bubbles present in a liquid.
FIG. 1c shows a detailed view of bubbles being collected at a pressure amplitude maximum.
FIG. 1d shows a detailed view of small bubbles being collected at a pressure amplitude maximum and larger bubbles being driven and collected at a pressure amplitude minimum.
FIG. 1e shows a bubble that traversed over a contaminated surface, leaving a cleaned path behind.

The resulting acoustic interference pattern (120) forms alternating regions of pressure amplitude maxima and minima within the liquid and at the solid-liquid interface at the substrate (130). Such a pressure maxima (150) and the ongoing mechanisms are shown in FIG. 1b-1d. If bubbles (101) are injected in the developed acoustic field, they will be sorted, depending on their size, towards the pressure amplitude maxima and minima. In a relatively weak acoustic field, a bubble driven below resonance (which means that the driving frequency of the imposed ultrasound field is below the fundamental resonance frequency of the bubble (calculated by the Minnaert equation)) moves to the pressure amplitude maximum (102). The bubbles typically grow due to coalescence in the pressure maxima until they reach the critical size given by the Minnaert equation they will start moving towards a pressure amplitude minimum (103).

Furthermore, it has been found that operating in an acoustic pressure range of from $10^{-3}$ bar to $10^3$ bar allows to manage (in combination with the selected operational frequency) the bubble activity, which allows bubbles to create surface modes, surface instabilities, volumetric oscillations even leading to heavy collapsing bubbles, and therefore can create acoustic streaming, shear stress or enrich the liquid-solid interface with one or more gaseous components. An example of such an activity is given in FIG. 1e, where a bubble (104) active in an applied acoustic field moves within the interference pattern and following a trajectory (105) can remove particulate contamination (106) from a substrate due to the local generation of shear stress.

The device according to the present invention is in preferred embodiments a single wafer wet processing station for treating semiconductor wafers.

Figure 2:
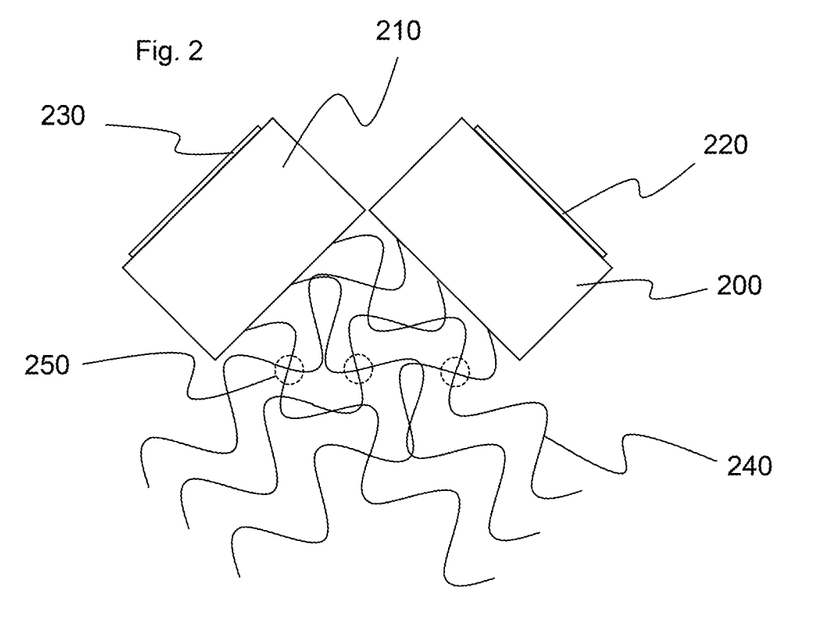
FIG. 2 shows a cross-sectional view of two resonators that generate an interference pattern in the liquid.

The creation of a near-field interference pattern within the liquid and at the liquid-solid interface plays a central role to arrange and activate bubbles. An alternative way to create such an interference pattern is shown in FIG. 2, which is based on the combination of two independent resonators. A first resonator, which consists of a piezoelectric crystal (230) glued on a solid element (210), is positioned at a selected angle between 1 and 45 degrees next to a second resonator, which consists as well of a piezoelectric crystal (220) glued on a solid element (200). Each resonator emits sound waves in the liquid at a selected operational frequency and the emitted sound waves recombine to create a specific interference pattern (240) with pressure amplitude minima and maxima (250).

Figure 3:
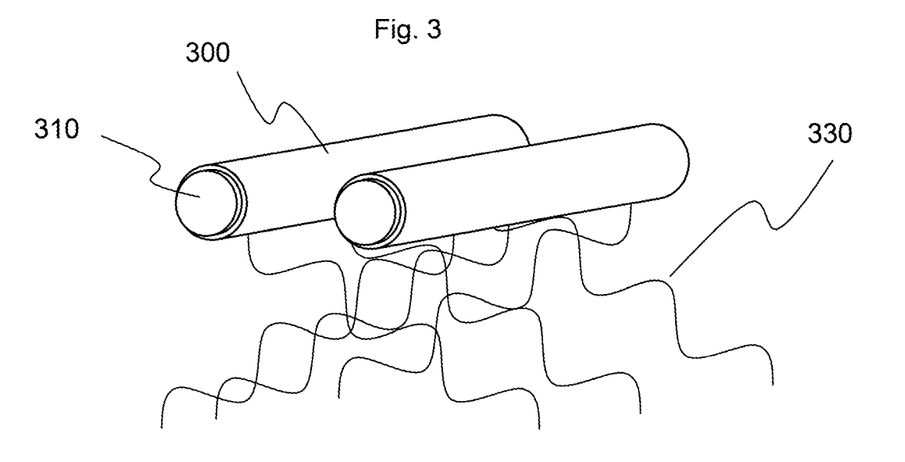
FIG. 3 shows an overview of two resonators that generate an interference pattern in the liquid.

A variation is shown in FIG. 3, where 2 rods (300), driven by a piezoelectric crystal (310) are positioned next to each other, and the emitted sound waves (330) of each rod will recombine to form again a unique interference pattern.

Besides the in situ heterogeneous nucleation of bubbles in the liquid, it is especially beneficial to inject bubbles directly in to the liquid, which allows to operate at acoustic pressure below the cavitation threshold (typically lower than 1 bar). Furthermore, bubble size distribution and content of the bubbles can be more easily tuned towards the targeted application. Examples of such a direct bubble injection into an acoustic field are shown in FIGS. 4a-4c and FIG. 5.

Figure 4A:
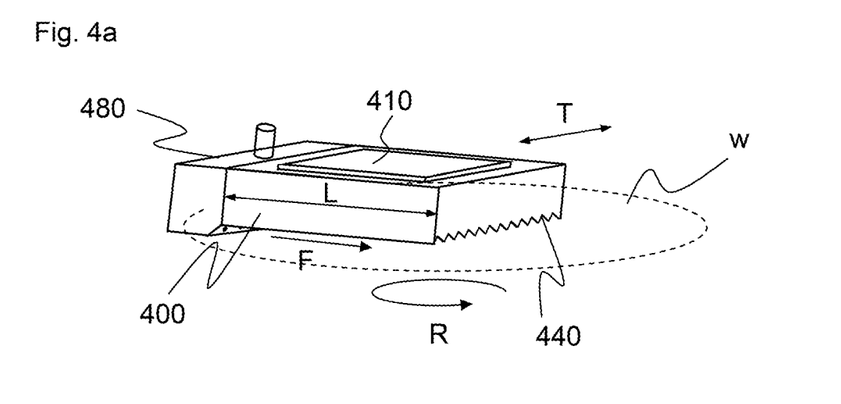
FIG. 4a shows an overview of the combination of a bubble injection machine with a resonator, close to a rotating substrate.

FIG. 4a is an example of a structured solid element (400), with a series of triangular grooves (440), to which a piezoelectric crystal (410) is attached. A bubble injection device (480) is positioned next to the grooves. The flow containing the bubbles (F) is preferably injected parallel to the regions of maximum and minimum pressure amplitude or alternatively under an angle up to 60 degrees. A typical length (L) over which a bubble flow can travel and have impact goes up to 5 cm. In this example a substrate (w) rotates (R) under the resonator and the resonator can execute a translation motion (T) to process the entire substrate.

Figure 4B:
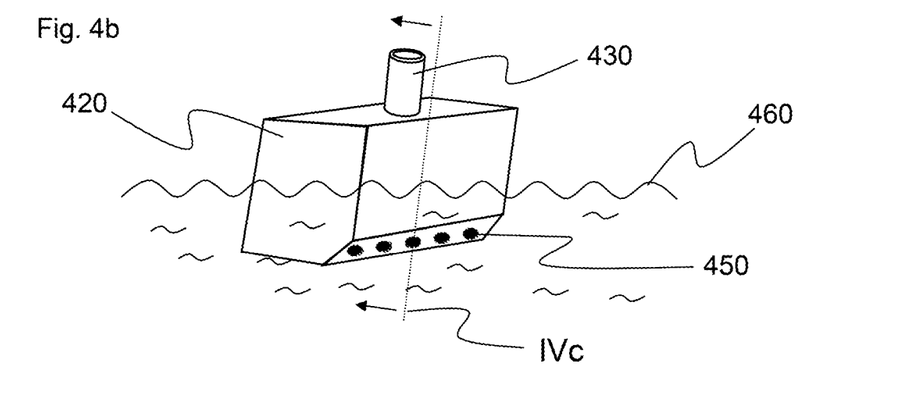
Figure 4C:
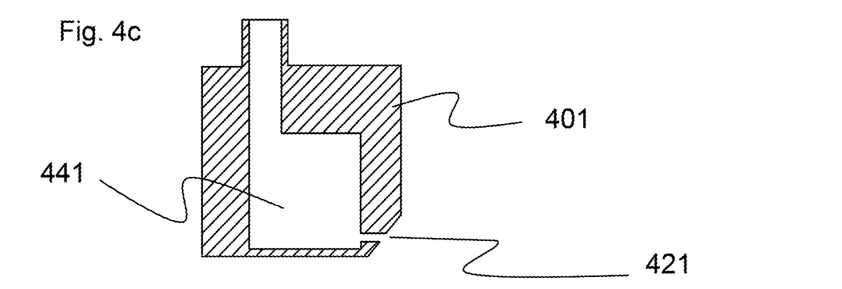
FIG. 4c shows a cross sectional view of the bubble machine of FIG. 4a, taken along the line IVc of FIG. 4b.

FIG. 4b shows a possible structure for the bubble machine (480) of FIG. 4a. In this right front perspective view, the main body housing (420) is shown, provided with one inlet opening (430). This inlet opening (430) has an inner diameter from about 1 mm to about 20 mm and is connected to an external medium supply unit, and provides a pressurized and a gasified medium to an inner chamber (441) of the bubble machine as shown in FIG. 4c. Injection orifices (450), (421) are positioned on an angled surface. Although 5 injection orifices are shown, there can be a wide range of injection orifices ranging from about 1 to about 30 per 100 $mm^2$, preferably about 16 per 100 $mm^2$. The injection orifices (450) have a diameter from about 50 μm to about 500 μm, but preferably between 100 and 350 μm and are designed to create a pressure drop in the medium between the inner chamber (441) and the surrounding medium (460), in which the bubble machine is immersed. This surrounding medium (460) can differ from the supplied medium. The pressure drop can be chosen in a range where the dissolved gas in the supplied medium starts to outgas. As a consequence of the outgassing, many small gas bubbles will be created and injected in the surrounding medium (460).

The immersion depth of the main body housing (420), (401) should be chosen such that the injection orifices (450), (421) are submerged in the surrounding medium (460) and therefore set between about 0.5 mm and about 350 mm for immersion in a tank or between about 0.3 mm and about 10 mm for immersion between two parallel plates. Alternatively, the main body housing (420), (401) can be entirely submerged in the surrounding medium (460).

Figure 5:
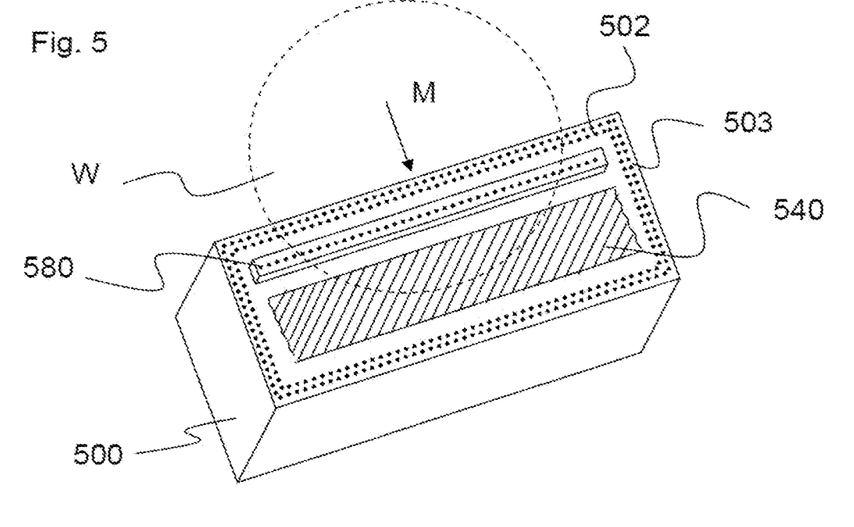
FIG. 5 shows an overview of the combination of a bubble injection machine with a resonator, close to a translating substrate.

An alternative design is given in FIG. 5, in which a structured solid element (500) has a series of triangular grooves (540) and a built-in bubble injection device (580). A series of process liquid inlets (502) and process liquid outlet (503) allow the wetting and dewetting of a substrate (W) while it moves linearly (M) over or under the resonator. Bubble injection device (580) may otherwise be as described for device (480).

Figure 6:
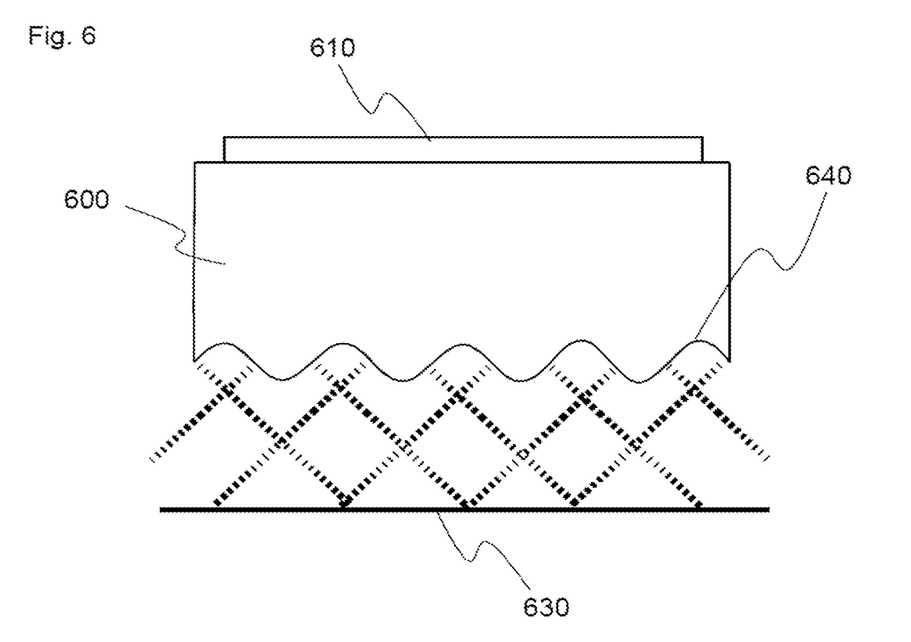
FIG. 6 shows a cross-sectional view of a resonator, with a solid structural element, where an interference pattern in the liquid and the solid-liquid interface is generated.

FIG. 6 shows an alternative structure of the solid element (600), which is connected to a piezoelectric crystal (610). The triangular grooves are replaced by a curved surface (640), which will generate depending on the geometry an interference pattern within the liquid and at the solid-liquid interface.

Figure 7:
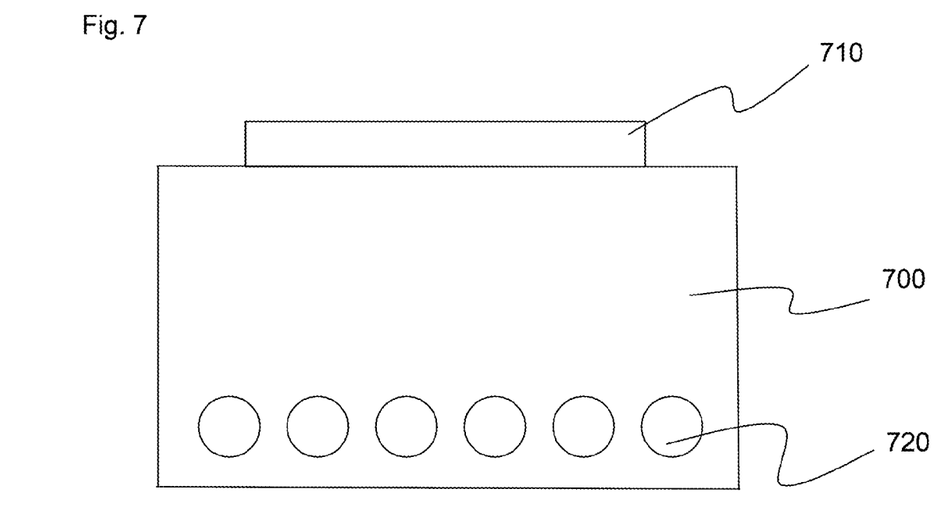
FIG. 7 shows a cross-sectional view of a flat resonator, where a geometrical structure is integrated in the inner volume of the solid element.
Figure 8:
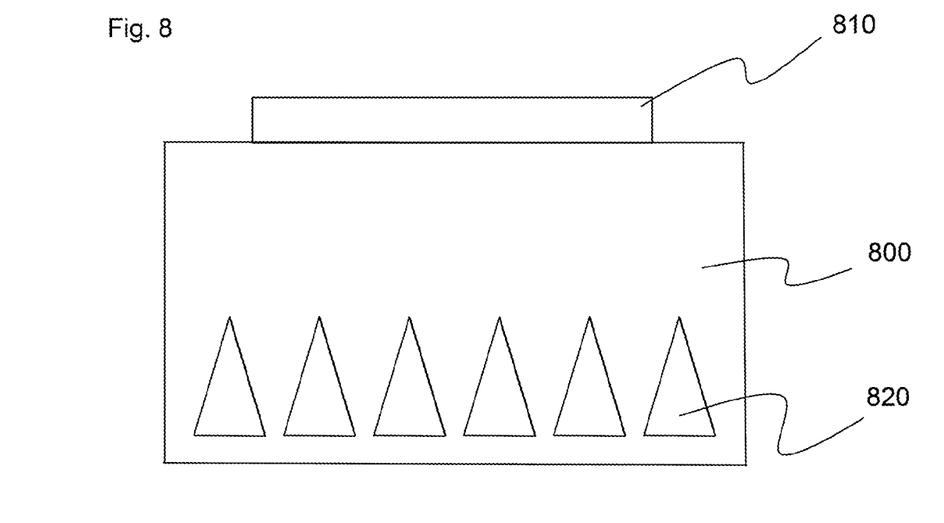
FIG. 8 shows a cross-sectional view of a flat resonator, where a geometrical structure is integrated in the inner volume of the solid element.

Furthermore, if a flat resonator is required as shown in FIGS. 7 and 8, a geometrical structure can be integrated in the inner volume (structured volumes) of the resonator within the solid element (700 and 800), which are connected to a piezoelectric crystal (710 and 810). The cross-sectional shape of such volume can vary from rounded openings (720) to ellipsoidal structures to triangular structures (820). These volumes can be filled with a liquid with a specific acoustic impedance to redirect the launched acoustic waves.

Figure 9A:
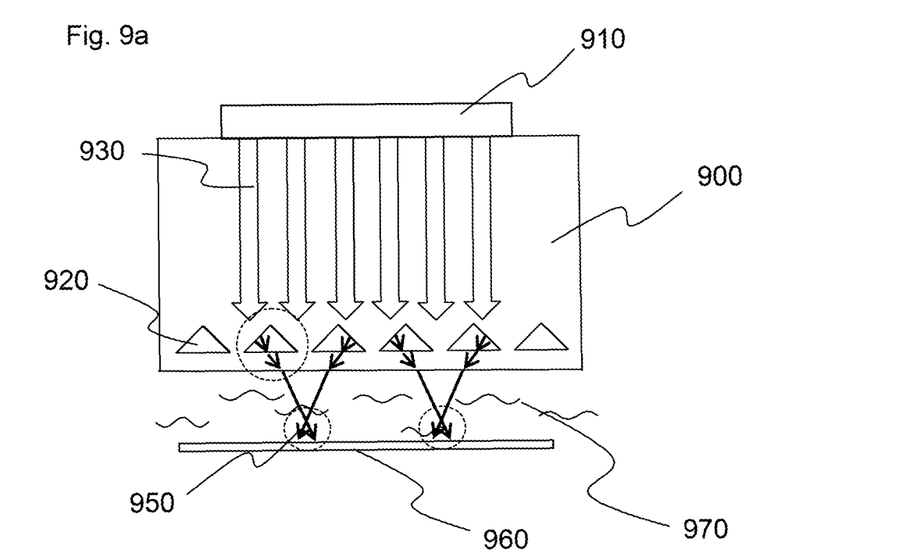
FIG. 9a shows a cross-sectional view of a flat resonator, where a geometrical structure is integrated in the inner volume of the solid element and where an interference pattern in the liquid and the solid-liquid interface is generated.
Figure 9B:
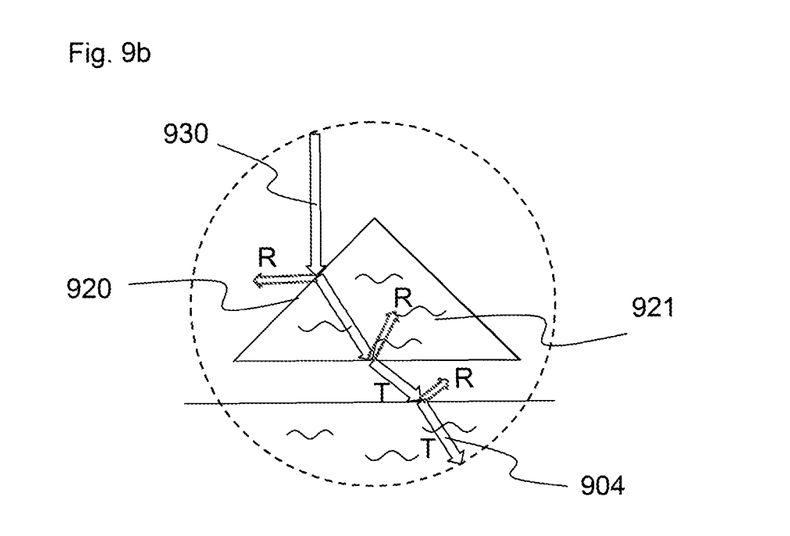
FIG. 9b shows a detailed cross-sectional view of a geometrical structure, filled with a liquid, where an incident acoustic wave is being reflected and transmitted.
Figure 10:
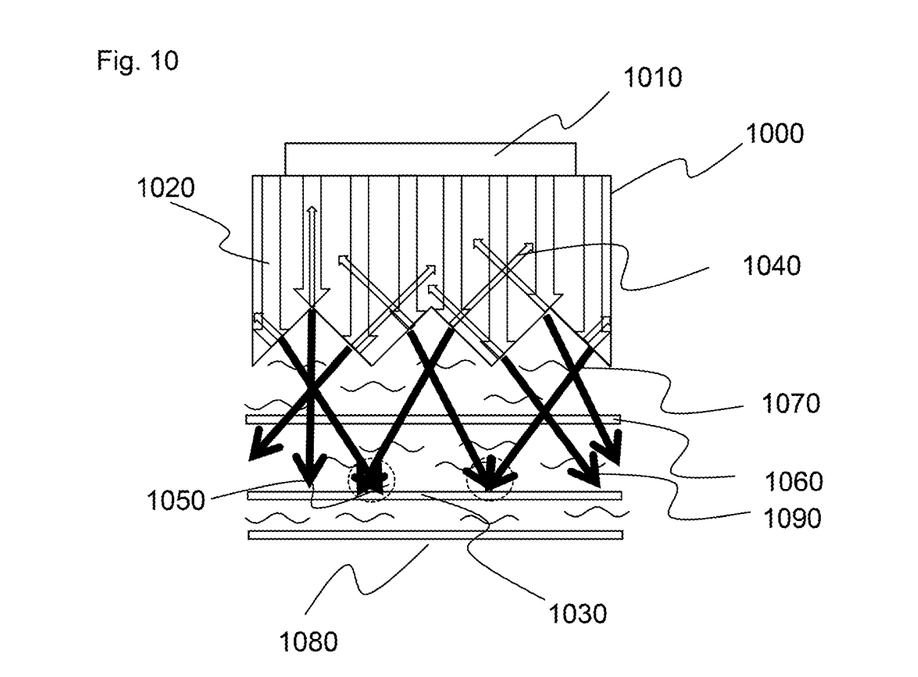
FIG. 10 shows a detailed cross-sectional view of a resonator with a solid structural element, where a coupling layer is positioned between article and resonator and on the backside a solid boundary is placed.

An example of the acoustic wave pathway is shown in FIG. 9a and more in detail in FIG. 9b. An electrically driven piezoelectric crystal (910) will launch an acoustic wave (930) in the solid element (900). When the wave passes through areas with different acoustic impedances (920), the wave will be partially reflected (R) and partially transmitted (T) at each interface. Depending on the acoustic impedance of the fluid (921), which is present in the volume (920), the angle under which the incident wave is transmitted can be calculated by Snell's law as well as the transmission coefficient. The trajectory (904) of this part of the acoustic wave ends up in the liquid (970) between the resonator and the substrate (960) and allows the creation of a unique interference pattern (950). FIG. 10, shows a resonator, which is a combination of a piezoelectric crystal 1010 and a solid element (1000), and is positioned in a coupling liquid (1070). This coupling liquid is separated from the process liquid (1090) by a thin layer (1060), which is sound transparent. A specific interference pattern (1050) can be established in both liquid volumes (coupling volume and process volume). On the backside of the substrate (1030) an additional solid boundary (1080) can be placed to reflect or absorb the sound waves which are being transmitted through the substrate (1030).

By virtue of the present invention it is possible to increase deposition and etch rates, improve selectivity, and increase the efficiency of rinsing. Embodiments of the present invention constructed according to the principles disclosed herein can generate and increase the concentration of short lifespan oxidizing species close to a substrate. This is in contrast to conventional techniques, which typically suffer from limited bubble activity at the surface (low amount of bubbles active per area), which in turn leads to long process times and uniformity issues, and small process windows regarding cleaning and specifically regarding the cleaning vs. damage-causing window. The present invention furthermore reduces the demand of conventional techniques for distance optimization (wafer-transducer) and for operation at higher powers required to overcome the cavitation initiation threshold.

It will be understood that the foregoing description and specific embodiments shown herein are merely illustrative of the invention and the principles thereof, and that modifications and additions may be easily made by those skilled in the art without departing for the spirit and scope of the invention, which is therefore understood to be limited only by the scope of the appended claims.

What is claimed is:

1. A device for treating a surface of an article with a fluid, comprising:
   a holder configured to position an article in a predetermined orientation;
   a source of ultrasonic or megasonic energy positioned so as to vibrate a fluid medium adjacent the article; and
   a generator of treatment fluid configured to discharge adjacent said source of ultrasonic or megasonic energy a treatment fluid after decreasing a pressure of said treatment fluid, such that gas previously dissolved in said liquid comes out of solution in the form of bubbles;
   wherein said source of ultrasonic or megasonic energy is configured to generate an interference pattern in said treatment fluid comprising regions of pressure amplitude minima and maxima at an interface of said treatment fluid and said article; and
   wherein said generator of treatment fluid is further configured to inject said treatment fluid parallel to the regions of pressure amplitude minima and maxima or at an angle thereto of up to 60 degrees.

2. The device according to claim 1, wherein the generator of treatment fluid comprises:
   a main body housing provided with an inlet opening;
   a plurality of injection orifices or an injection slit provided in the main body; and an external liquid medium supply unit connected to the inlet opening.

3. The device according to claim 1, wherein the source of ultrasonic or megasonic energy comprises a resonator positioned adjacent to the space to be occupied by the article so that a gap is formed with a width w of about 0.1 mm to about 10 mm.

4. The device according to claim 1, wherein the source of ultrasonic or megasonic energy comprises a resonator having a series of triangular grooves that direct the ultrasonic or megasonic energy to create said interference pattern.

5. The device according to claim 1, wherein the source of ultrasonic or megasonic energy comprises a resonator having plural piezoelectric elements mounted on a monolithic body and facing at oblique angles to an article positioned on the holder.

6. The device according to claim 1, wherein the source of ultrasonic or megasonic energy comprises a resonator having at least one internal volume containing a liquid whose impedance differs from that of said treatment fluid.

7. The device according to claim 1, wherein said device is a single wafer wet processing station for treating semiconductor wafers.

8. A device for treating a surface of an article with a fluid, comprising:
   a holder configured to position an article in a predetermined orientation;
   a source of ultrasonic or megasonic energy positioned so as to vibrate a fluid medium adjacent the article; and
   a generator of treatment fluid configured to discharge adjacent said source of ultrasonic or megasonic energy a treatment fluid comprising a dispersion of gas bubbles in a treatment liquid, said bubbles being generated at an acoustic pressure less than one bar;
   wherein said source of ultrasonic or megasonic energy is configured to generate an interference pattern in said treatment fluid comprising regions of pressure amplitude minima and maxima at an interface of said treatment fluid and said article; and
   wherein said generator of treatment fluid is further configured to inject said treatment fluid parallel to the regions of pressure amplitude minima and maxima or at an angle thereto of up to 60 degrees.

9. The device according to claim 8, wherein the source of ultrasonic or megasonic energy comprises a resonator having a series of triangular grooves that direct the ultrasonic or megasonic energy to create said interference pattern.

10. The device according to claim 8, wherein the source of ultrasonic or megasonic energy comprises a resonator having plural piezoelectric elements mounted on a monolithic body and facing at oblique angles to an article positioned on the holder.

11. The device according to claim 8, wherein said device is a single wafer wet processing station for treating semiconductor wafers.

* * * * *